United States Patent [19]

Hsue

[11] Patent Number: 5,369,048
[45] Date of Patent: Nov. 29, 1994

[54] STACK CAPACITOR DRAM CELL WITH BURIED BIT-LINE AND METHOD OF MANUFACTURE

[75] Inventor: Chen-Chiu Hsue, Hsin-chu, Taiwan, Prov. of China

[73] Assignee: United Microelectronics Corporation, Hsinchu, Taiwan, Prov. of China

[21] Appl. No.: 112,126

[22] Filed: Aug. 26, 1993

[51] Int. Cl.$^5$ ............................................. H01L 21/70
[52] U.S. Cl. ...................................... 437/52; 437/48; 437/60
[58] Field of Search .................. 437/47, 48, 52, 60, 437/919

[56] References Cited

U.S. PATENT DOCUMENTS

| | | | |
|---|---|---|---|
| 5,006,481 | 4/1991 | Chan et al. | 437/52 |
| 5,059,548 | 10/1991 | Kim | 437/52 |
| 5,061,651 | 10/1991 | Imo | 437/52 |
| 5,116,776 | 5/1992 | Chan et al. | 437/52 |
| 5,155,056 | 10/1992 | Jeong-Gyoo | 437/47 |
| 5,162,249 | 11/1992 | Kim | 437/52 |
| 5,166,090 | 11/1992 | Kim et al. | 437/52 |

OTHER PUBLICATIONS

"Reliability & Characterization of Composite Oxide/Nitride Dielectrics for Multi-Megabit Dynamic Random Access Memory Stacked Capacitors", J. Electrochem., Soc., vol. 138, No. 7, 2052–2056 (Jul. 1991).
"A New Stacked Capacitor DRAM Cell Characterized by a Storage Capacitor on a Bit-Line Structure" IEDM 596–599 (1988).
"A Capacitor-Over-Bit Line (COB) Cell with a Hemispherical-Grain Storage Node For 64Mb DRAMs" IEDM 90-655 to 90-658 (1990).

Primary Examiner—Tom Thomas
Attorney, Agent, or Firm—George O. Saile; Graham S. Jones, II

[57] ABSTRACT

A DRAM cell of transistors with a stack capacitor includes a gate comprising a word line formed over the gate oxide layer. The cell is made by depositing a first dielectric layer over the gate, etching through the first dielectric layer to form a bit-line contact opening therein exposing a portion of the surface of the drain, deposition of a bit-line layer over the product of etching the first dielectric layer and into the bit-line opening, forming a mask and etching the bit-line from the bit-line layer, deposition of second dielectric layer, deposition of a first lower capacitor plate, node contact etching a trench down to expose the source, deposition of dielectric spacer material into the node contact region, masking and etching to form spacers on the side wall of the trench into which node contact is to be made, deposition of a lower capacitor plate layer forming the top portion of a two layer capacitor plate with the first lower capacitor plate layer, the second lower capacitor plate layer extending down into the node contact trench to contact the surface of source, depositing a capacitor dielectric layer over the lower capacitor plate and depositing an upper capacitor plate layer over the capacitor dielectric.

12 Claims, 3 Drawing Sheets

STACK CAPACITOR DRAM CELL WITH BURIED BIT-LINE AND METHOD OF MANUFACTURE

BACKGROUND OF THE INVENTION

1. Field of the Invention

This invention relates to integrated circuits and more particularly to capacitors in memory devices.

2. Description of Related Art

U.S. Pat. No. 5,116,776 of Chan et al "Method of Making a Stacked Capacitor for DRAM Cell" describes a storage node composed of multiple layers of polysilicon sandwiched between two polysilicon ground plate layers.

U.S. Pat. No. 5,155,056 of Jeong-Gyoo "Process for Formation of Cells having Self-Aligned Capacitor Contacts, and Structure Therefor" describes a method of making a stacked capacitor from polysilicon. The stack polysilicon is patterned using photoresist and an ion implantation is performed using the stack polysilicon as a mask.

In Fazan et al "Reliability and Characterization of Composite Oxide/Nitride Dielectrics for Multi-Megabit Dynamic Random Access Memory Stacked Capacitors", J. Electrochem. Soc., Vol. 138, No. 7, 2052-2056 (July 1991) describes at page 2053 in FIG. 1 stacked DRAM cell. The disadvantages are firstly that the bit line contact step coverage is a problem and the aspect ratio is very high. It is even a greater problem for increasing the storage node height to increase capacitance. Secondly, the capacitor area is limited by bit line contact to cell plate alignment limitations. Thus, a buried bit line approach is desirable to solve such problems.

Kimura et al "A New Stacked Capacitor DRAM Cell Characterized by a Storage Capacitor on a Bit-line Structure" IEDM 596-599 (1988) describes a Diagonal Active Stacked cell with a Highly-packed storage node (DASH) device in FIG. 2 thereof on page 597. The disadvantages of the DASH cell are the diagonal active area and word line layout. The device is more sensitive to polysilicon to active alignment. Secondly, the node contact to bit line has alignment limitations or must use the complicated Self-Aligned Contact (SAC) technique.

Sakao et al "A Capacitor-Over-Bit-Line (COB) Cell with a Hemispherical-Grain Storage Node for 64 Mb DRAMs" IEDM 90-655 to 90-658 (1990) shows on page 657 in FIG. 1 thereof an illustration of the bit and word lines interconnection. A first layer polysilicon 1 word line is vertical to the third layer polysilicon 3 bit line. The interconnection line is composed of polysilicon 2. Disadvantages of the COB cell are first that one needs an extra local interconnection layer for the node extension and secondly, as above, that the node contact to the bit lines also have alignment limitations or must use the complicated Self-Aligned Contact (SAC) technique.

An object of this invention is to use a rectangular active area which is not sensitive to polysilicon alignment.

Another object of this invention is connecting a storage node directly through a bit line so there are no alignment issues or need for complicated Self Aligned Contact (SAC) techniques.

A third object of this invention is to retain all the advantages of a buried bit line DRAM cell.

Still another object of this invention is to connect the storage plate directly through a polysilicon bit line to contact the N+ node to prevent an extra local interconnect layer thereby simplifying the process and the topology.

SUMMARY OF THE INVENTION

In accordance with this invention, a DRAM cell with an integrated circuit stack capacitor on a semiconductor substrate comprising a source region, a drain region, a gate oxide layer formed over said source and drain region and a gate comprising a word line formed over said gate oxide layer, made by said steps of (a) deposition of a first dielectric layer over said gate layer, (b) etching through said first dielectric layer to form a bit-line contact opening therein exposing the surface of said drain region, (c) deposition of a bit-line conductor layer over said product of (b) and into said bit-line contact opening, (d) forming a mask and etching said bit-line pattern from said bit-line conductor layer, (e) deposition of a second dielectric layer, (f) deposition of a first lower capacitor plate layer, (g) node contact etching a trench down through said intermediate layers to form a node contact opening exposing a portion of the surface of said source region, (h) deposition of a third dielectric layer adapted to form dielectric spacers, (i) forming a mask and etching said third dielectric layer leaving spacer structures on said side wall of said trench into which node contact is to be made, (j) deposition of a second lower capacitor plate layer forming the top portion of a two layer capacitor plate with the first lower capacitor plate layer, the second lower capacitor plate layer extending down into the node contact trench to make contact to the top surface of source region, (k) depositing a capacitor dielectric layer over the lower capacitor plate structure, and (l) depositing an upper capacitor plate layer over the capacitor dielectric.

Preferably, the first dielectric layer is formed by CVD deposition of silicon dioxide at a low temperature of about 450° C. to a thickness of between about 1500 Å and about 3000 Å. Preferably, a mask is formed and bit-line contact etching is performed opening a bit-line contact opening through the first dielectric layer down to the drain region. It is further preferred that, a polysilicon bit-line layer is deposited over the first dielectric layer and into the bit-line contact opening. Still another preferred feature of this invention is that a mask is formed and the bit-line layer is etched to form a bit-line. It is also preferred that a second dielectric layer of silicon dioxide layer is deposited by CVD to a thickness of between about 1500 Å and about 2000 Å. Preferably, the lower capacitor plate is deposited by LPCVD to a thickness of between about 500 Å and about 5000 Å. Another preferred aspect of this invention is that a node contact trench is formed by a stacked dry etch sequence employing dry etchants down to the top surface of the source region. An additional feature of the invention is the deposition of a third dielectric layer of silicon dioxide is provided to a thickness of between about 1500 Å and about 2500 Å to form material for silicon dioxide spacers. Preferably, a spacer is formed from the third dielectric layer dry etching in the node contact area.

exposing the top surface of region of the source region, but leaving silicon dioxide spacer structures on the side wall of the trench into which the node contact is etched. Preferably, the second lower capacitor plate layer comprises polysilicon deposited to a thickness of between about 800 Å and about 2500 Å extending down into the node contact trench to make electrical contact to the top surface of the source region. A Preferred feature is that the capacitor dielectric layer is formed by the steps of deposition of a layer of nitride with a thin layer of oxide about 30 Å thick to form the dielectric layer of the storage capacitor and deposition of a polysilicon layer to a thickness of between about 800 Å and about 2500 Å to form the upper layer of the capacitor plate. A method of manufacture of an integrated circuit capacitor on a semiconductor substrate, comprising the steps of forming a first insulating layer over the substrate, forming a bit line on the insulating layer, forming a first plate of the capacitor connected electrically to the storage node, forming a dielectric on the first plate, and forming a second plate on the dielectric, nitride/oxide.

BRIEF DESCRIPTION OF THE DRAWINGS

The foregoing and other aspects and advantages of this invention are explained and described below with reference to the accompanying drawings, in which:

FIG. 5 is more detailed.

DESCRIPTION OF THE PREFERRED EMBODIMENT

Figure 1:
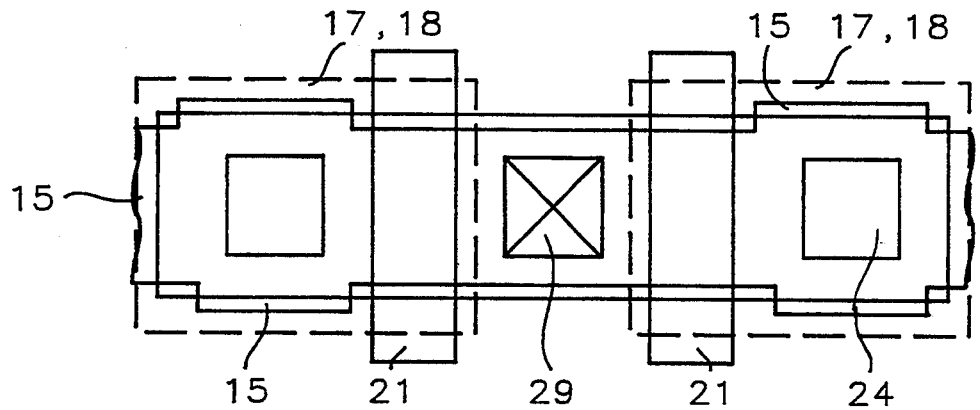
FIG. 1 shows a plan view of a MOSFET device in accordance with this invention.

A MOSFET device in accordance with this invention is shown in a plan view in FIG. 1. A set of polysilicon 1 wordline structures 21 extend vertically across the device. A polysilicon 2 bitline structure 15 passes horizontally from right to left on top of the device above the wordline structures 21. Deposited over the bitline structure 15 are the two plates of a capacitor comprising the polysilicon 3 storage plate 17 and the polysilicon 4 storage plate 18. A storage node contact 24 is shown, as is a bitline contact 29 between the wordline structures 21.

Figure 2:
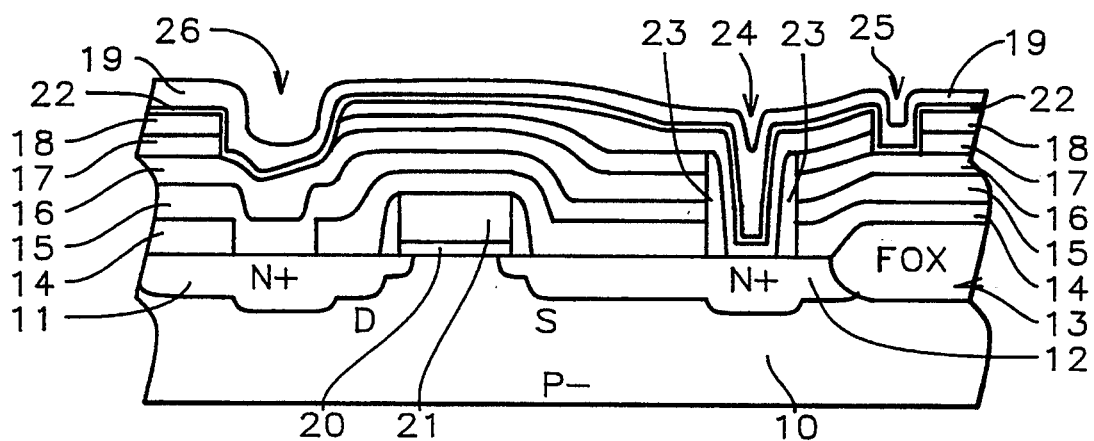
FIGS. 2 and 3 are sections through a MOSFET device such as the one shown in FIG. 1 taken at different points along the device.
Figure 3:
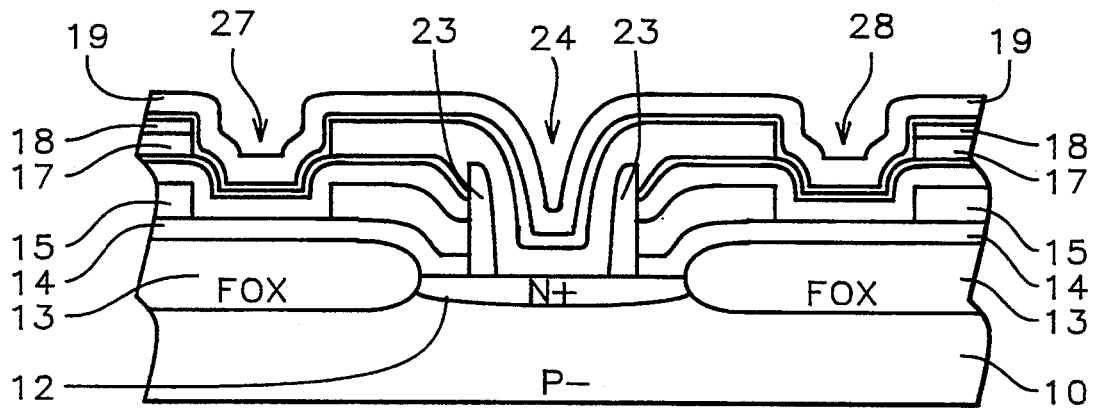
Figure 4:
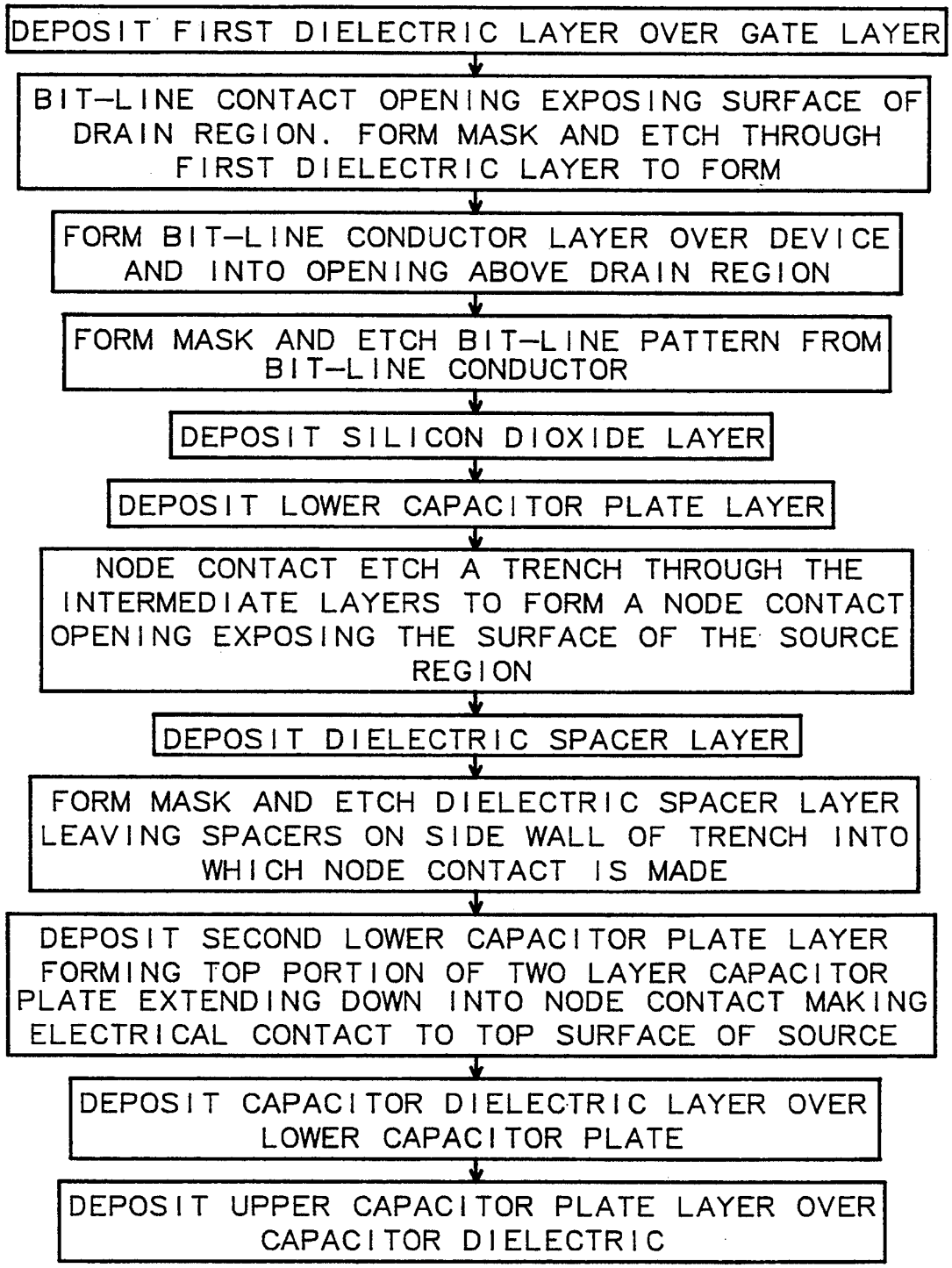
FIGS. 4 and 5 show flow charts for the process of the invention.
Figure 5:
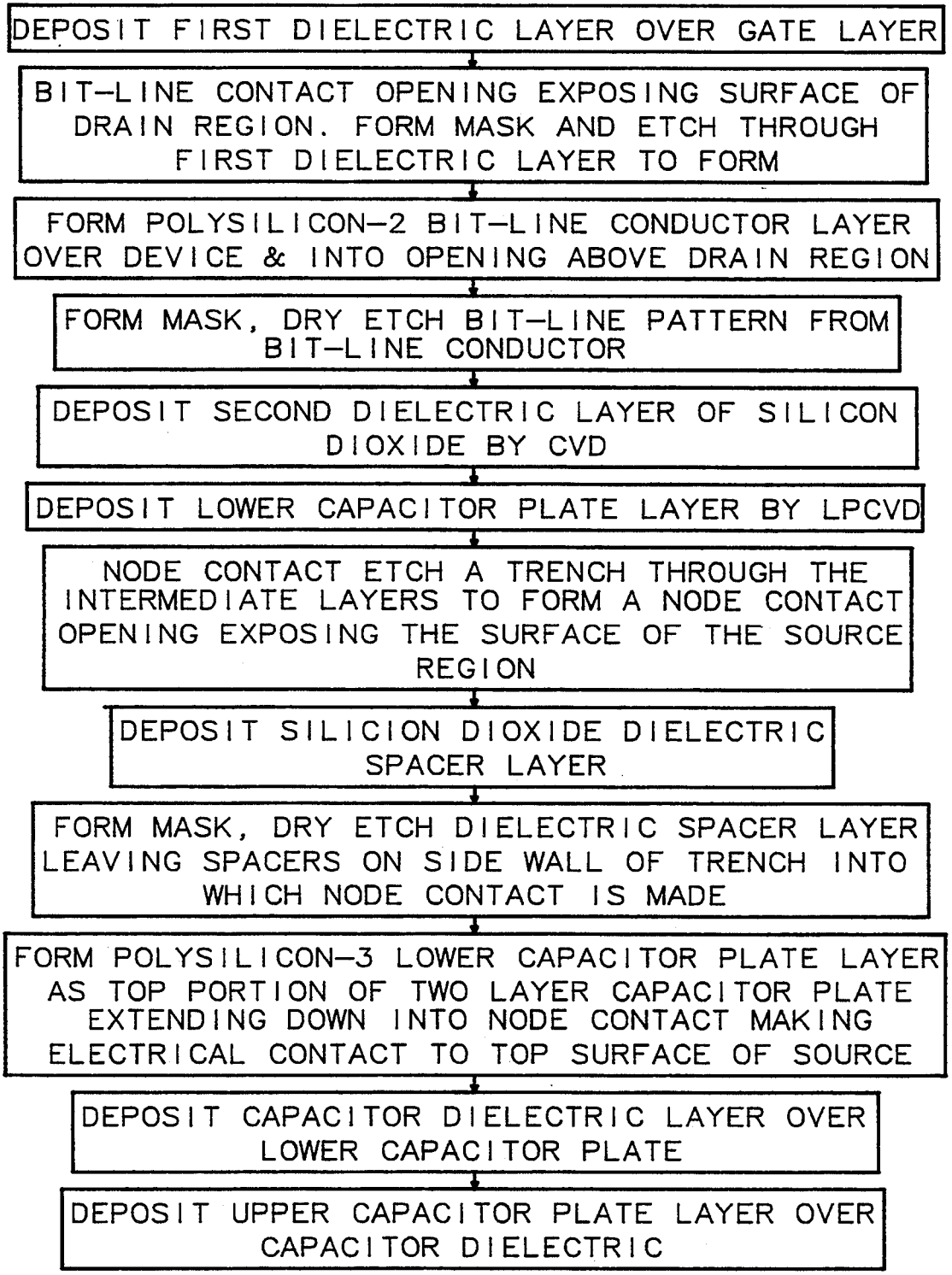

FIGS. 2 and 3 are sections through a MOSFET device taken at different points along the device. The substrate 10, carries a MOSFET transistor with a source/drain 11/12. The substrate 10 comprises a P− well region or P− sub, including a bitline N+ doped contact region 11 which comprises the drain of a cell of the DRAM. The substrate 10 also includes a storage node N+ doped region 12 which comprises the corresponding source of the DRAM cell. A gate oxide layer 20 covers substrate 10 between and above the proximate ends of region 11 and region 12. Formed on top of the gate oxide layer 20 is a word line 21 composed of polysilicon (poly 1) or polycide, bridging between the source 12 and drain 11 atop the gate oxide layer 20 to complete the transistor. A field oxide (FOX) layer 13 is formed on substrate 10 at the other end of the source region 12. An interpoly oxide dielectric layer 14 is deposited over the substrate 10 and the FOX layer 13. The wordline structure 21 also forms the gate of the transistor including the drain 11 and the source 12. A polysilicon 2 (poly 2), bit-line layer 15 lies on top of the oxide layer 14. Dielectric layer 16 comprises silicon dioxide (oxide) serving as an interpoly oxide layer between the bitline 15 polysilicon 2 and capacitor plate 17 polysilicon 3 (poly 3).

Capacitor plate layer 17 is polysilicon 3 and capacitor plate layer 18 overlies layer 17. Top capacitor plate layer 19, which is a combined top capacitor plate and ground plate is composed of polysilicon 5. Above capacitor plate layer 18 is the capacitor dielectric layer 22, which preferably comprises an nitride/oxide (NO) dielectric material which serves as the interlayer dielectric between polysilicon (poly 4) layer 18 and top capacitor plate 19. To repeat the polysilicon (poly 5) ground plate 19 cover lies on top of the dielectric layer 22, covering the entire area of the device.

Spacers 23 are formed on either side of the storage node contact area 24. Node contact 24 provides storage plate contact to the DRAM cell source junction. The area 25 comprises a space between adjacent cells on storage node side in FIG. 2. There is spacing 26 between adjacent cell in bit line contact side in FIG. 2. The spacing 27 between adjacent cells in the word line direction is shown in FIG. 3. The spacing 28 between adjacent cells in word line direction on the opposite side of the device in FIG. 3.

The trench permits increasing capacitance. The trench is possible after spacer etching and then Si-etch. Thus polysilicon 3 will etch away and etch stop on the $SiO_2$ layer 16 in spacing areas 25 and 26.

STEPS FOR DRAM CELL AFTER N+/P+ S/D IMPLANTATION AND ANNEAL

1. CVD deposition of a first dielectric layer of silicon dioxide layer 14 at low temperature of about 450° C. to a thickness of between about 1500 Å and about 3000 Å.
2. Forming a mask and bit-line contact etching through oxide layer 14, buffered HF or dry etching, etc.
3. Polysilicon 2 bit-line 15 deposition (polycide can be used in place of polysilicon) typically $WSi_2$ from $WF_6$ and silane deposition.
4. Forming a mask and etching to form bit-line 15. Polycide dry etch, where applicable.
5. CVD deposition of a second dielectric silicon dioxide layer 16 to a thickness of between about 1500 Å and about 2000 Å.
6. Polysilicon 3 LPCVD deposition of layer 17 to a thickness of between about 500 Å and about 5000 Å depending upon etching.
7. Etching a Node contact trench 24 down to source 12: Node contact lithography is provided providing a mask. Then the mask is used to etch as follows:
   a) polysilicon 3 layer 17
   b) oxide layer 16
   c) polysilicon 2 layer 15, and
   d) oxide layer 14 etching.

This is a stacked dry etch sequence employing conventional dry etchants well known to those skilled in the art opening down to the top surface of region 12, which comprises the region of storage node contact 24 as well as the source of the DRAM cell.

8. Silicon dioxide material 23 is formed in node contact trench 24 by CVD deposition (comprising a third dielectric layer) to a thickness of between about 1500 Å and about 2500 Å to provide material for formation of silicon dioxide spacers 23 in the next step.

9. Spacers 23 are formed by dry etching down into the trench in node contact area 24 exposing the top surface of region 12, but leaving silicon dioxide spacer structures 23 on the side wall of the trench into which node contact 24 is made.
10. Polysilicon 4 layer 18 is deposited to a thickness of between about 800 Å and about 2500 Å extending down into node contact 24 to make electrical and mechanical contact to the top surface of region 12, which comprises the source of the DRAM cell, as well as forming the top portion of the two layer capacitor plate plate.
11. A fourth dielectric layer 22 is formed by the steps of deposition of nitride/nitridation LPCVD SiH2Cl2+NH3 at about 820° C., or steam air at between about 900° C. and about 1000° C., resulting in a layer of nitride with a thin layer of oxide about 30 Å, to form the dielectric layer of the storage capacitor.
12. Polysilicon 5 layer 19 is formed by deposition to a thickness of between about 800 Å and about 2500 Å to form the upper layer of the capacitor plate.

STEPS 13-21 FOR MULTI-LAYER CAPACITOR

Steps 14-21 are duplicates of steps 6-12, except step 20.

13. Nitride/nitridation
14. Polysilicon 6 deposition
15. Node Contact Mask and Etching
16. CVD deposition
17. Spacer etching
18. Polysilicon 7 deposition
19. Nitride/nitridation
20. Polysilicon Via Mask and Etching (Contact polysilicon 5 with polysilicon 8)
21. Polysilicon 8 deposition

END OF STEPS 13-21 FOR MULTI-LAYER CAPACITOR

Steps 22-25 are simply the normal backend process.
22. BPSG deposit & flow
23. Contact masking
24. Metal masking
25. Alloy Note that the purpose of polysilicon 3 is to provide an etch stopper for spacer 23, so it is an optional layer depending upon process capability.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of manufacture of an integrated circuit DRAM cell with a stack capacitor on a semiconductor substrate comprising a source region, a drain region, a gate oxide layer formed over said source and drain region and a gate comprising a word line formed over said gate oxide layer, comprising the steps of
   (a) deposition of a first dielectric layer over said gate layer,
   (b) forming a mask and etching through said first dielectric layer to form a bit-line contact opening therein exposing a portion of the surface of said drain region,
   (c) formation of a bit-line conductor layer over the product of (b) and into said bit-line contact opening,
   (d) forming a mask and etching a bit-line pattern from said bit-line conductor layer,
   (e) deposition of a second dielectric layer composed of silicon dioxide,
   (f) deposition of a lower capacitor plate layer, wherein said bit-line pattern, said silicon dioxide layer, and said lower capacitor plate layer are intermediate layers,
   (g) node contact etching a trench through said intermediate layers including said lower capacitor plate layer, said silicon dioxide layer and said bit-line pattern to form a node contact opening exposing the surface of said source region,
   (h) deposition of a dielectric spacer layer to form material for dielectric spacers in said trench comprising said node contact opening,
   (i) forming a mask and etching said dielectric spacer layer leaving spacer structures on the side wall of the trench comprising said node contact opening into which node contact is made,
   (j) deposition of a second lower capacitor plate layer forming the top portion of the two layer capacitor plate extending down into said trench forming said node contact opening to make electrical contact to the top surface of source region,
   (k) depositing a capacitor dielectric layer over said lower capacitor plate structure, and
   (l) depositing an upper capacitor plate layer over said capacitor dielectric.

2. A method of manufacture of a DRAM cell with an integrated circuit stack capacitor in accordance with claim 1 wherein said first dielectric layer is formed by CVD deposition of silicon dioxide at a low temperature of about 450° C. to a thickness of between about 1500 Å and about 3000 Å.

3. A method of manufacture of a DRAM cell with an integrated circuit stack capacitor in accordance with claim 1 wherein a mask is formed and bit-line contact etching with buffered HF or dry etching is performed opening a bit-line contact opening through said first dielectric layer down to said drain region.

4. A method of manufacture of a DRAM cell with an integrated circuit stack capacitor in accordance with claim 3 wherein a polysilicon bit-line layer is deposited over said first dielectric layer and into said bit-line contact opening.

5. A method of manufacture of a DRAM cell with an integrated circuit stack capacitor in accordance with claim 4 wherein a mask is formed and said bit-line layer is etched with dry etching to form said bit-line pattern.

6. A method of manufacture of a DRAM cell with an integrated circuit stack capacitor in accordance with claim 5 wherein said second dielectric layer of silicon dioxide layer is deposited by CVD to a thickness of between about 1500 Å and about 2000 Å.

7. A method of manufacture of a DRAM cell with an integrated circuit stack capacitor in accordance with claim 6 wherein said lower capacitor plate is deposited by LPCVD to a thickness of between about 500 Å and about 5000 Å.

8. A method of manufacture of a DRAM cell with an integrated circuit stack capacitor in accordance with claim 7 wherein said node contact trench is formed by a stacked dry etch sequence employing dry etchants down to the top surface of said source region.

9. A method of manufacture of a DRAM cell with an integrated circuit stack capacitor in accordance with claim 8 wherein deposition of said spacer layer provides silicon dioxide to a thickness of between about 1500 Å and about 2500 Å to form material for silicon dioxide spacers.

10. A method of manufacture of a DRAM cell with an integrated circuit stack capacitor in accordance with claim 9 wherein said spacer layer is shaped by dry etching in the node contact area exposing the top surface of region of said source region, but leaving said silicon dioxide spacer structures on said side walls of said trench into which said node contact is etched.

11. A method of manufacture of a DRAM cell with an integrated circuit stack capacitor in accordance with claim 10 wherein said second lower capacitor plate layer comprises polysilicon deposited to a thickness of between about 800 Å and about 2500 Å extending down into said node contact trench to make electrical contact to the top surface of said source region.

12. A method of manufacture of a DRAM call with an integrated circuit stack capacitor in accordance with claim 11 wherein said capacitor dielectric layer is formed by the steps of deposition of a layer of nitride with a thin layer of oxide about 30 Å thick to form the dielectric layer of the storage capacitor and deposition of a polysilicon layer to a thickness of between about 800 Å and about 2500 Å to form said upper layer of said capacitor plate.

* * * * *